(12) United States Patent
Lee et al.

(10) Patent No.: US 9,147,842 B2
(45) Date of Patent: Sep. 29, 2015

(54) PHOTORESIST EMPLOYING PHOTODIMERIZATION CHEMISTRY AND METHOD FOR MANUFACTURING ORGANIC LIGHT EMITTING DIODE DISPLAY USING THE SAME

(71) Applicants: LG Display Co., Ltd., Seoul (KR); INHA Industry Partnership Institute, Incheon (KR)

(72) Inventors: Jinkyun Lee, Incheon (KR); Youngmi Kim, Incheon (KR); Jonggeun Yoon, Gunpo-si (KR); Joonyoung Heo, Seoul (KR); Euidoo Do, Goyang-si (KR); Yeonkyeong Lee, Seoul (KR); Soohyun Kim, Incheon (KR)

(73) Assignees: LG Display Co., Ltd., Seoul (KR); INHA Industry Partnership Institute, Seoul (KR)

( * ) Notice: Subject to any disclaimer, the term of this patent is extended or adjusted under 35 U.S.C. 154(b) by 60 days.

(21) Appl. No.: 13/903,657

(22) Filed: May 28, 2013

(65) Prior Publication Data
US 2014/0154827 A1    Jun. 5, 2014

(30) Foreign Application Priority Data
Nov. 30, 2012  (KR) .................. 10-2012-0138223

(51) Int. Cl.
| | | |
|---|---|---|
| C08F 20/10 | (2006.01) |
| C08F 20/24 | (2006.01) |
| H01L 51/00 | (2006.01) |
| G03F 7/004 | (2006.01) |
| G03F 7/038 | (2006.01) |
| H01L 27/32 | (2006.01) |

(52) U.S. Cl.
CPC ............ H01L 51/0018 (2013.01); C08F 20/10 (2013.01); C08F 20/24 (2013.01); G03F 7/0046 (2013.01); G03F 7/038 (2013.01); G03F 7/0384 (2013.01); H01L 27/3283 (2013.01)

(58) Field of Classification Search
None
See application file for complete search history.

(56) References Cited

U.S. PATENT DOCUMENTS

2010/0028805 A1\*  2/2010  Hatanaka ................... 430/281.1

\* cited by examiner

*Primary Examiner* — Robert Sellers
(74) *Attorney, Agent, or Firm* — Fenwick & West LLP

(57) ABSTRACT

A highly fluorinated photoresist employing a photodimerization chemistry and a method for manufacturing an organic light emitting diode display using the same. The photoresist includes a copolymer that is made from two different monomers. When the copolymer is used as a photoresist, the photoresist has the characteristic that it becomes insoluble when exposed to an ultraviolet light having a wavelength of 365 nm.

14 Claims, 6 Drawing Sheets

PHOTORESIST EMPLOYING PHOTODIMERIZATION CHEMISTRY AND METHOD FOR MANUFACTURING ORGANIC LIGHT EMITTING DIODE DISPLAY USING THE SAME

CROSS-REFERENCE TO RELATED APPLICATIONS

This application claims the benefit of Korea Patent Application No. 10-2012-0138223 filed on Nov. 30, 2012, which is incorporated herein by reference in its entirety.

BACKGROUND

1. Field of the Invention

The present disclosure relates to a highly fluorinated photoresist employing a photodimerization chemistry and a method for manufacturing an organic light emitting diode display using the same.

2. Discussion of the Related Art

Nowadays, various flat panel display devices are developed for overcoming many drawbacks of the cathode ray tube such as heavy weight and bulk volume. The flat panel display devices include the liquid crystal display device (or LCD), the field emission display (or FED), the plasma display panel (or PDP) and the electroluminescence device (or EL).

FIG. 1 is a plane view illustrating the structure of the organic light emitting diode display (or 'OLED') having active switching elements such as thin film transistors according to the related art. FIG. 2 is a cross sectional view illustrating the structure of the OLED along to the cutting line of I-I" in FIG. 1 according to the related art.

Referring to FIGS. 1 and 2, the OLED display comprises a thin film transistor (or 'TFT') substrate having the thin film transistors ST and DT and an organic light emitting diode OLED connected to and driven by the thin film transistors ST and DT, and a cap ENC joining the TFT substrate with an organic adhesive POLY (not shown) therebetween. The TFT substrate includes a switching thin film transistor ST, a driving thin film transistor DT connected to the switching thin film transistor ST, and an organic light emitting diode OLED connected to the driving thin film transistor DT.

On a transparent substrate SUB, the switching thin film transistor ST is formed where a gate line GL and a data line DL cross each other. The switching thin film transistor ST selects the pixel which is connected to the switching thin film transistor ST. The switching thin film transistor ST includes a gate electrode SG branching from the gate line GL, a semiconductor channel layer SA overlapping with the gate electrode SG, a source electrode SS and a drain electrode SD. The driving thin film transistor DT drives an anode electrode ANO of the organic light emitting diode OD disposed at the pixel selected by the switching thin film transistor ST. The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OD.

As one example, FIG. 2 shows the thin film transistor of top gate structure. In this case, the semiconductor channel layers SA and DA of the switching thin film transistor ST and the driving thin film transistor DT are firstly formed on the substrate SUB and the gate insulating layer GI covering them and then the gate electrodes SG and DG are formed thereon by overlapping with the center portion of the semiconductor channel layers SA and DA. After that, at both sides of the semiconductor channel layers SA and DA, the source electrodes SS and DS and the drain electrodes SD and DD are connected thereto through contact holes penetrating an insulating layer IN. The source electrodes SS and DS and the drain electrodes SD and DD are formed on the insulating layer IN.

In addition, at the outer area surrounding the display area where the pixel area is disposed, a gate pad GP formed at one end of the gate line GL, a data pad DP formed at one end of the data line DL, and a driving current pad VDP formed at one end of the driving current line VDD are arrayed. A passivation layer PAS is disposed to cover the upper whole surface of the substrate SUB having the switching and the driving thin film transistors ST and DT. After that, the contact holes are formed to expose the gate pad GP, the data pad DP, the driving current pad VDP and the drain electrode DD of the driving thin film transistor DD. Over the display area within the substrate SUB, a planar layer PL is coated. The planar layer PL makes the roughness of the upper surface of the substrate SUB in much smoother condition, for coating the organic materials composing the organic light emitting diode on the smooth and planar surface condition of the substrate SUB.

On the planar layer PL, the anode electrode ANO is formed to connect the drain electrode DD of the driving thin film transistor DT through one of the contact holes. On the other hand, at the outer area of the display area not having the planar layer PL, formed are a gate pad electrode GPT, a data pad electrode DPT and a driving current electrode VDPT connected to the gate pad GP, the data pad DP and the driving current pad VDP, respectively, exposed through the contact holes. On the substrate SUB, a bank BA is formed covering the display area, excepting the pixel area. Finally, a spacer SP may be formed over some portion of the bank BA.

A cap ENC is joined to the TFT substrate. In that case, it is preferable that the TFT substrate and the cap ENC are completely sealed by having an organic adhesive between them. The gate pad electrode GPT and the data pad electrode DPT are exposed and may be connected to external devices via the various connecting means.

As the needs for the organic light emitting diode display increase, and more advanced manufacturing technologies are developing, the technologies for the high resolution and large area organic light emitting diode displays has become underdeveloped. Until now, there are some methods for forming organic light emitting diodes on a large glass substrate, i.e., the fine metal mask (or 'FMM') patterning technology, the ink jetprinting technology, and the laser patterning technology. As an alternative method for manufacturing a large area organic light emitting diode display, a method for depositing one large white organic light emitting diode layer with a patterned color filter layer can also be used.

Using these patterning technologies or methods, it is possible to manufacture an organic light emitting diode display having large area and high resolution. However, the production yields and/or costs are not acceptable for mass production. In order to manufacture the pixel area of high resolution on a large area substrate, the most reasonable method is the photolithography method. There is still a critical problem for using the photolithography technology when patterning the organic light emitting materials. For example, the organic light emitting material can be easily damaged by the photoresist itself and the solvent used for developing and/or removing the photoresist.

SUMMARY

In order to overcome the above mentioned drawbacks, the purpose of the present disclosure is to suggest a highly fluorinated photoresist which is less interactive with organic light emitting materials, and a method for manufacturing an organic light emitting diode display using the same photoresist. Another purpose of the present disclosure is to suggest a highly fluorinated photoresist which is changing the solubility by the photodimerization reaction of anthracene to minimize the damage of the organic light emitting diode material, and a method for manufacturing an organic light emitting diode display using the same photoresist.

In one embodiment, a copolymer for a photoresist is disclosed. The copolymer is formed by a process that includes providing a first monomer represented by formula (1) and a second monomer represented by formula (2)

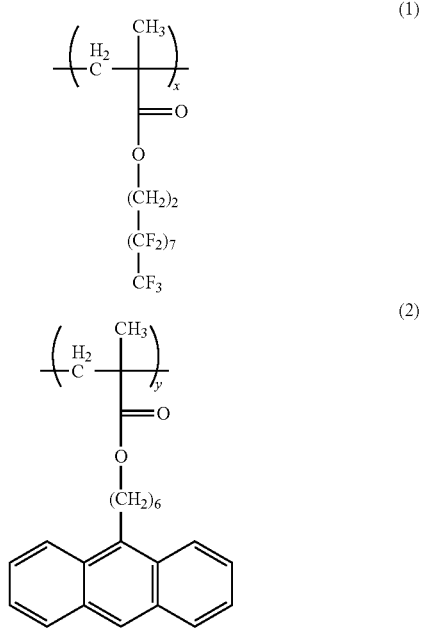

where x:y is a ratio of the first monomer to the second monomer and x:y is selected from the range of x:y=1:0.1 to x:y=1:1. The copolymer is formed from the first monomer and the second monomer. When the copolymer is used as a photoresist, the photoresist has the characteristic that it becomes insoluble when exposed to an ultraviolet light having a wavelength of 365 nm.

In one embodiment, x:y is selected from the range of x:y=1:0.19 to x:y=1:0.77. In some embodiments, x:y can be 1:0.19, x:y can be 1:0.25, x:y can be 1:0.38, x:y can be 1:0.58, or x:y can be 1:0.77.

In one embodiment, the present disclosure includes a method for manufacturing an organic light emitting diode display comprising: forming an electrode on a substrate; depositing an organic light emitting layer on the electrode; depositing a photoresist on the organic light emitting layer, the photoresist including the above mentioned copolymer; patterning the photoresist into a patterned photoresist by exposing the photoresist to an ultraviolet light through a mask; patterning the organic light emitting layer into a patterned organic light emitting layer using the patterned photoresist; and stripping the patterned photoresist.

In one embodiment, the present disclosure includes a method for manufacturing an organic light emitting diode display comprising: forming an electrode on a substrate; depositing a photoresist on the electrode, the photoresist including the above mentioned copolymer; patterning the photoresist into a patterned photoresist by exposing the photoresist to an ultraviolet light through a mask; depositing an organic light emitting layer on the patterned photoresist and the electrode; and removing the patterned photoresist and portions of the organic light emitting layer on the patterned photoresist.

In one embodiment, the ultraviolet light has a wavelength of 365 nm. In one embodiment, the photoresist is patterned with a fluorinated solvent.

The highly fluorinated photoresist according to the present disclosure has the characteristics in which its solubility is changed by the photodimerization reaction of anthracene and less interaction with organic light emitting materials. As it has no anthracene, any strong acid material is not be formed when developing the photoresist. As a result, by using the highly fluorinated photoresist less interaction with the organic light emitting materials, it is possible to manufacture the organic light emitting diode display having the high resolution on the large area substrate. Furthermore, in the method for manufacturing the organic light emitting diode display according to the present disclosure, as it is possible to use the same material when developing the photoresist and removing the photoresist, the manufacturing process can be simple, the cost may be reduced, and the production yield may be high.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Figure 1:
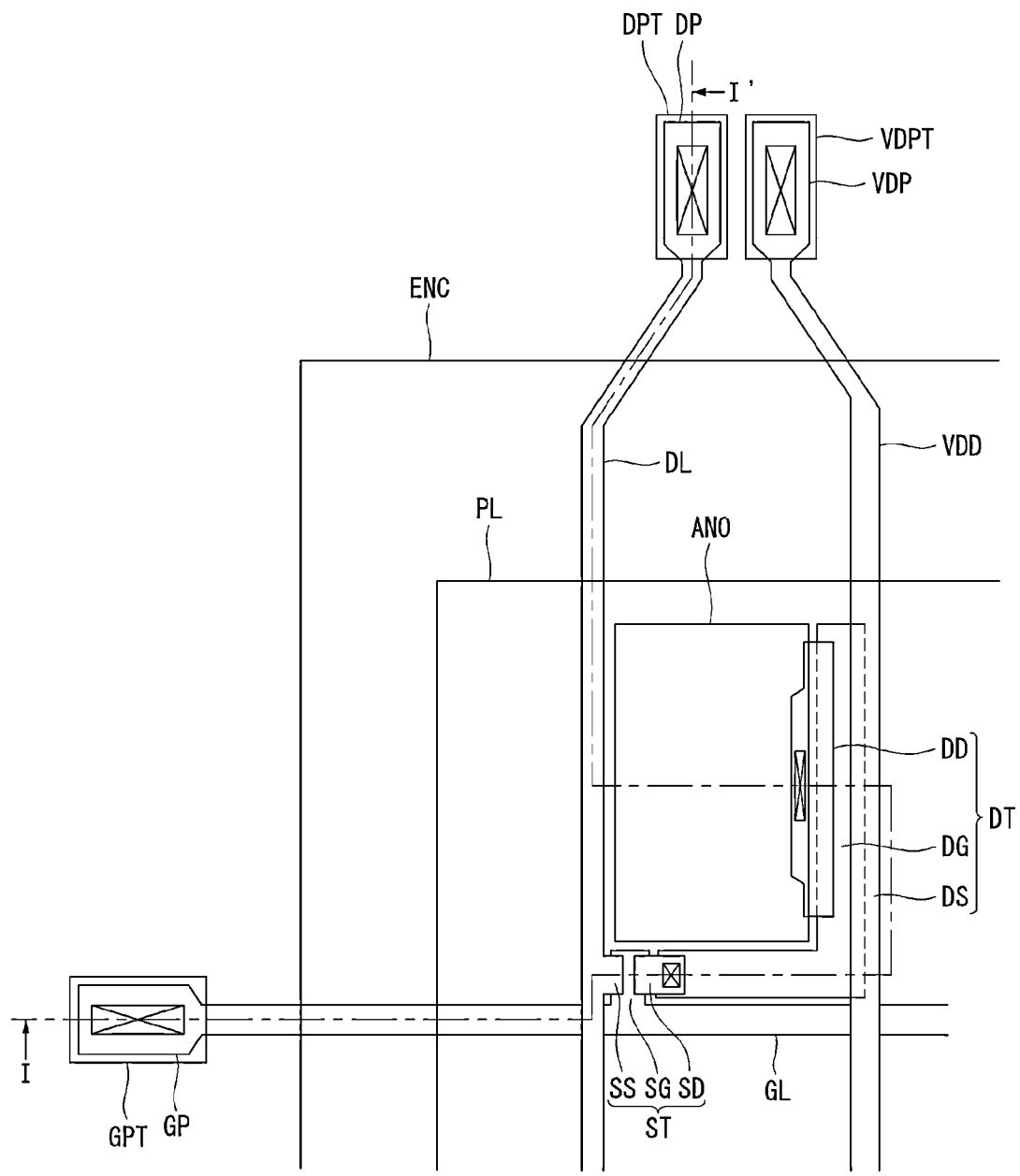
FIG. 1 is the plane view illustrating the organic light emitting diode display using the thin film transistor according to the related art.

Embodiments of the present disclosure are explained herein by references to the figures. Like reference numerals designate like elements throughout the detailed description.

However, the present disclosure is not restricted by these embodiments but can be applied to various changes or modifications without changing the technical spirit. In the following embodiments, the names of the elements are selected by considering the easiness for explanation so that they may be different from actual names.

At first, a novel highly fluorinated photoresist will be explained. The highly fluorinated photoresist according to the present disclosure includes a copolymer that is synthesized from two monomers, 3,3,4,4,5,5,6,6,7,7,8,8,9,9,10,10-Heptadecafluorodecyl Methacrylate (FDMA) and 6-(anthracene-9-yl)hexyl methacrylate (AHMA):

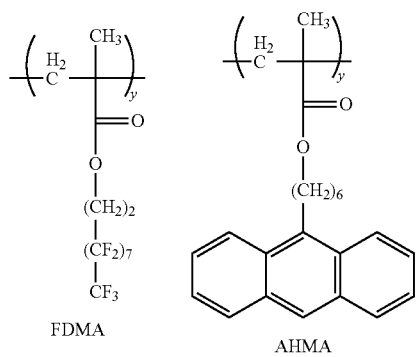

where x:y is a ratio of monomer FDMA to monomer AHMA used in synthesizing the co-polymer. In one embodiment, x:y is selected from the range of x:y=1:0.1 to x:y=1:1, as explained below. In one embodiment, FDMA has a molecular weight of 532.19, and AHMA has a molecular weight of 346.46.

In one embodiment the resulting photoresist co-polymer formed from FDMA and AHMA is a statistical or random co-polymer and can be represented with the following chemical formula, where r refers to the random nature of the co-polymer:

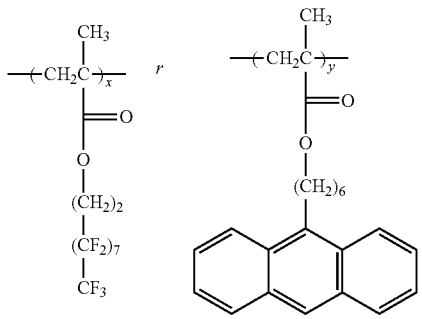

Figure 3:
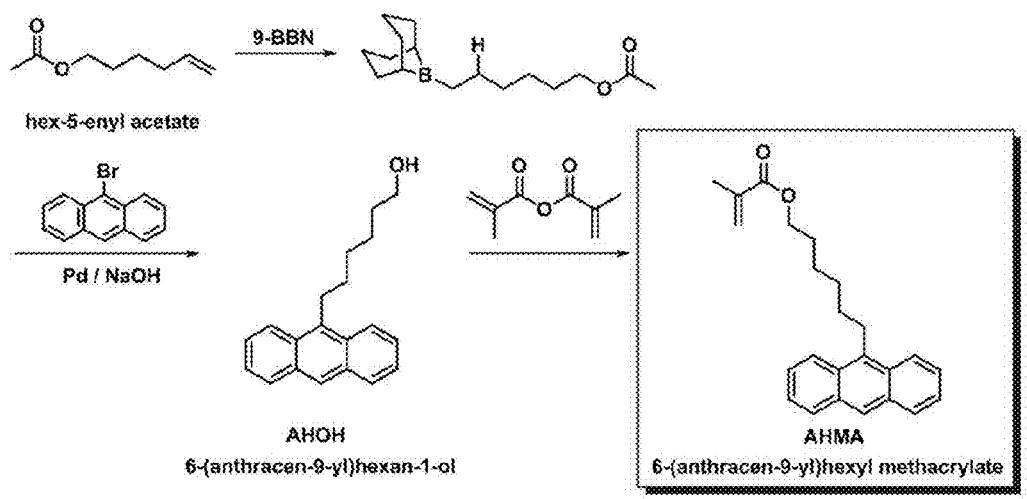
FIG. 3 is a schematic view illustrating steps for synthesizing a highly fluorinated photoresist according to the present disclosure.

Hereinafter, referring to FIG. 3, we will explain an example for synthesizing the highly fluorinated photoresist copolymer according to the present disclosure. The following description is just one example of synthesizing a copolymer so that the present disclosure is not limited by this example. FIG. 3 is a schematic view illustrating steps for synthesizing a highly fluorinated photoresist according to the present disclosure.

SYNTHESIZING EXAMPLE

Synthesizing of the Represented by the Formula 1

1) The synthesizing of 6-(anthracen-9-yl)hexan-1-ol (AHOH).

5-Hexenyl acetate (2.00 g, 14.06 mmol) and 9-Borabicyclo [3.3.1]nonane (0.5M solution in THF) (9-BBN) (25.21 g, 14.06 mmol) were put into a first flask of 250 ml. A stirring process was then performed for 3 hours at room temperature under $N_2$ gas condition. After putting 3M NaOH solution (9.14 ml), 9-Bromoanthracene (3.30 g, 12.80 mmol), and THF anhydrous (25 $cm^3$) into a second flask of 100 ml, a bubbling process was performed three times. After that, Tetrakis(triphenylphosphine)palladium(0) (Pd(PPh3)4) (0.44 g, 0.38 mmol) was added into the second flask and the bubbling process was performed three times again. The mixture of the 5-Hexenyl acetate and the 9-BBN of the first flask was put together with the mixture of the second flask, under $N_2$ gas condition, to perform a reaction process under a temperature of 85 C for 18 hours. After the reaction, the temperature was lowered to room temperature, and the reaction was completed by adding distilled water (22.85 ml) and the toluene (57.14 ml). After that, using HCl, a neutralization process was performed. With EA and brine, the work-up process was performed to the neutralized product. Using $MgSO_4$, moisture was removed. After purifying this compositing material, using Hexane (30 $cm^3$) and toluene (10 $cm^3$), a recrystallization process was performed. After filtering and drying the material in the vacuum oven, a yellow powder synthesized (or 'composition') material (2.78 g, 71%) was acquired.

2) The synthesizing of AHMA.

The synthesized 6-(anthracen-9-yl)hexan-1-ol (AHOH) (2.78 g, 10.00 mmol), 4-Dimethylaminopyridine (DMAP) (1.830 g, 14.98 mmol), 2,6-Di-Tert-butyl-4-methylphenol (BHT) (polymerization inhibitor, 0.01 g), Methacrylic anhydride (3.079 g, 1997 mmol), and DCM anhydrous (30 $cm^3$) were put into a flask of 250 ml. A stirring process was then performed for 4 hours under room temperature. After that, MeOH (1 cm3) was added, and a stirring process was performed again for 1 hour. After purifying the composition material, an oil type synthesized material (1.94 g, 56%) having a light yellow color was acquired.

3) The synthesizing of the FDMA-AHMA co-polymer.

FDMA (4.00 g) and AHMA (0.65 g) were put into a tube of 25 $cm^3$. α,α,α-trifluorotoluene (5.00 $cm^3$) and purified AIBN (0.048 g) were added. After sealing the tube, using a vacuum pump and $N_2$ gas, a $N_2$ substitution process was performed through three freeze-thaw cycles. After nitrogen substitution, under $N_2$ gas condition, the solution was stirred for 12 hours under a temperature of 72 degrees C. After that, a precipitation process was performed using Hexane and the solvent was removed in a vacuum oven, there resulting in a white powder synthesized material (3.834 g).

In other embodiments, the FDMA-AHMA co-polymer was synthesized using the same fixed mass of FDMA (4.00 g) but with different masses of AHMA, such as with AHMA masses of 0.50 g, 1.00 g, 1.50 g and 2.00 g. The following table illustrates different combinations of FDMA and AHMA used in synthesizing the FDMA-AHMA co-polymer:

TABLE 1

| FDMA mass (g) | AHMA mass (g) | molecular ratio of FDMA to AHMA |
|---|---|---|
| 4 g | 0.5 g | 1:0.19 |
| 4 g | 0.65 g | 1:0.25 |
| 4 g | 1.0 g | 1:0.38 |
| 4 g | 1.5 g | 1:0.58 |
| 4 g | 2.0 g | 1:0.77 |

Figure 4:
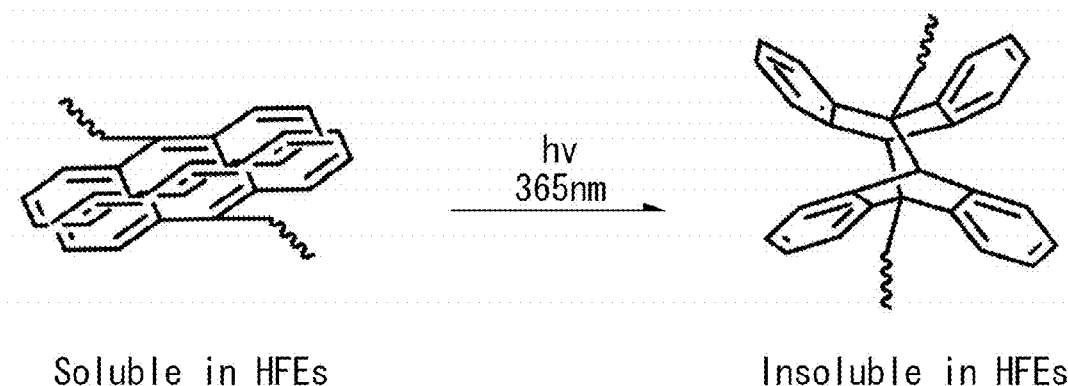
FIG. 4 is a schematic view illustrating the change of the soluability characteristics of the highly fluorinated photoresist by the wavelengths of the ultralight according to the present disclosure.

Each of the FDMA-AHMA copolymers from Table 1 was tested and found to have the same photo characteristics. Specifically, the photo characteristics of the co-polymer used as the novel synthesized highly fluorinated photoresist is shown in FIG. 4. FIG. 4 is a schematic view illustrating the change of the soluability characteristics of the highly fluorinated photoresist by the wavelengths of ultraviolet light according to the present disclosure. Referring to FIG. 4, just after being synthesized, the novel highly fluorinated photoresist was soluble in hydrofluoroethers (HFEs). However, after being exposed to an ultraviolet light of 365 nm wavelength, the structure of the highly fluorinated photoresist was changed so that it became insoluble in hydrofluoroethers (HFEs).

Hereinafter, referring to FIGS. 5A to 5D, a method for manufacturing an organic light emitting diode display according to the first embodiment of the present disclosure is now explained. FIGS. 5A to 5D are cross sectional views illustrating a method for manufacturing an organic light emitting diode display according to the first embodiment of the present disclosure.

Figure 2:
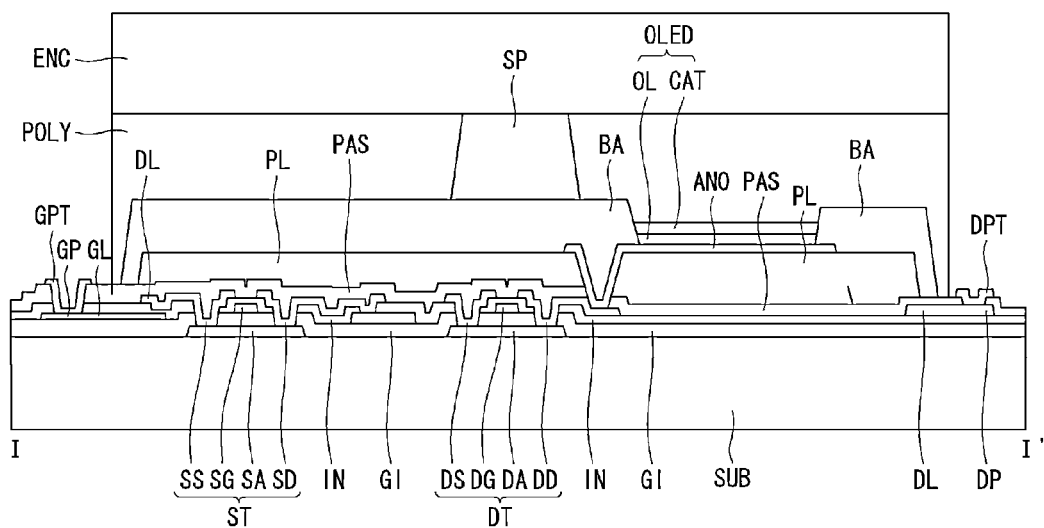
FIG. 2 is the cross sectional view illustrating the structure of the organic light emitting diode display cutting along the line I-I' in FIG. 1, according to the related art a back light unit generating the collimated light beam using a collimation lens.

On a substrate SUB, an anode electrode ANO is deposited. For the case of the active type organic light emitting diode display, as shown in FIGS. 1 and 2, the thin film transistor may first be formed. After that, the anode electrode ANO is formed to connect to the drain electrode of the thin film transistor. As the present embodiment is related to the method for patterning the organic light emitting material, the explanation for other elements of the display including thin film transistor may not be mentioned in detail.

Figure 5A:
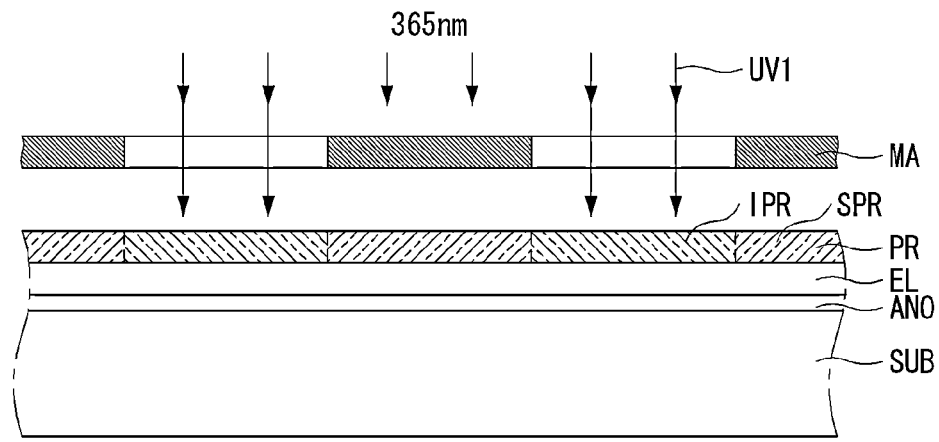
FIGS. 5A to 5D are cross sectional views illustrating a method for manufacturing an organic light emitting diode display according to the first embodiment of the present disclosure.

As shown in FIG. 5A, on the anode electrode ANO, an organic light emitting material is deposited to form an organic light emitting layer EL. On the organic light emitting layer EL, the highly fluorinated photoresist PR is deposited. After positioning a mask MA having a pre-determined mask pattern over the photoresist PR, a first ultraviolet light UV1 having a wavelength of 365 nm is radiated over the mask MA. Then, according to the pattern of the mask MA, some portions of the photoresist PR are exposed to the first ultraviolet light UV1 and other portions of the photoresist PR are not affected by the first ultraviolet light UV1. Due to the characteristics of the highly fluorinated photoresist PR, the portions of the photoresist PR exposed by the first ultraviolet light UV1 change into an insoluble photoresist IPR. On the contrary, the portions not exposed by the first ultraviolet light UV1 are unchanged and remain as the soluble photoresist SPR.

Figure 5B:
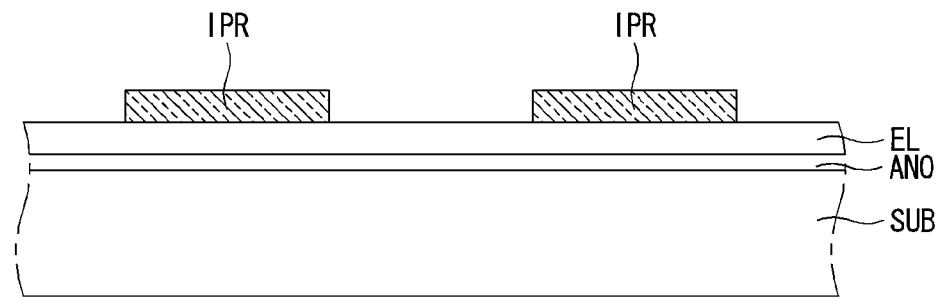

After exposure, by developing the photoresist PR with a fluorinated solvent such as hydrofluoroethers, the soluble photoresist SPR may be removed. However, the insoluble photoresist IPR remains on the organic light emitting layer EL, as shown in FIG. 5B.

Figure 5C:
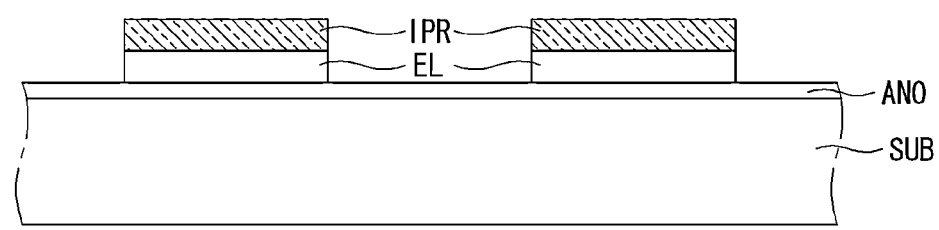

Using the insoluble photoresist IPR as a mask, the organic light emitting layer EL is patterned. Thus, the organic light emitting layer EL can be formed into the same pattern as the insoluble photoresist IPR, as shown in FIG. 5C.

Figure 5D:
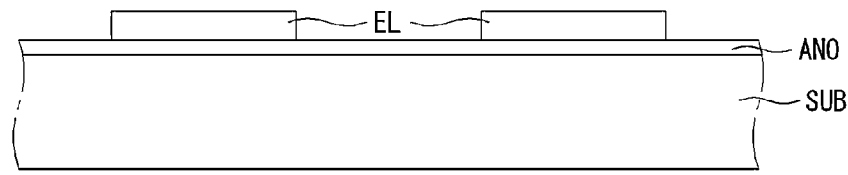

After that, using a chemical stripper, the insoluble photoresist IPR may be removed, as shown in FIG. 5D. In the photolithography process according to the first embodiment of the present disclosure, the insoluble photoresist IPR is formed on the organic light emitting layer EL by the pattern of the mask MA and the organic light emitting layer EL is patterned according to the shape of the insoluble photoresist IPR.

Hereinafter, referring to FIGS. 6A to 6D, we will explain a method for manufacturing an organic light emitting diode display according to the second embodiment of the present disclosure. FIGS. 6A to 6D are cross sectional views illustrating a method for manufacturing an organic light emitting diode display according to the second embodiment of the present disclosure.

On a substrate SUB, an anode electrode ANO is deposited. For the case of the active type organic light emitting diode display, as shown in FIGS. 1 and 2, the thin film transistor may first be formed. After that, the anode electrode ANO is formed to connect to the drain electrode of the thin film transistor. As the present embodiment is related to the method for patterning the organic light emitting material, the explanation for other elements of the display including thin film transistors may not be mentioned in detail.

Figure 6A:
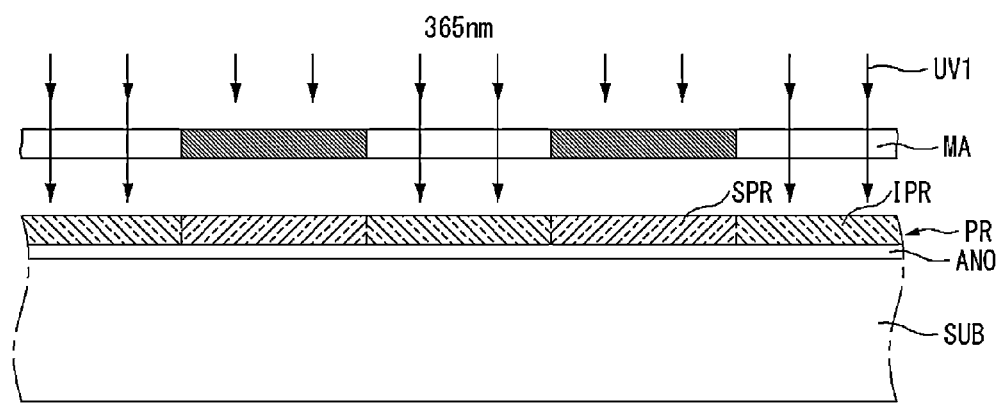
FIGS. 6A to 6D are cross sectional views illustrating a method for manufacturing an organic light emitting diode display according to the second embodiment of the present disclosure.

As shown in FIG. 6A, on the anode electrode ANO, the highly fluorinated photoresist PR according to the present disclosure is deposited. After positioning a mask MA having a pre-determined mask pattern over the photoresist PR, a first ultraviolet light UV1 having wavelength of 365 nm is radiated over the mask MA. Then, according to the pattern of the mask MA, some portions of the photoresist PR are exposed to the first ultraviolet light UV1, and other portions of the photoresist PR are not influenced by the first ultraviolet light UV1. Due to the characteristics of the photoresist PR according to the present disclosure, the portions exposed by the first ultraviolet light UV1 may be changed into the insoluble photoresist IPR. On the contrary, the portions not exposed by the first ultraviolet light UV1 are not changed and remain as the soluble photoresist SPR.

Figure 6B:
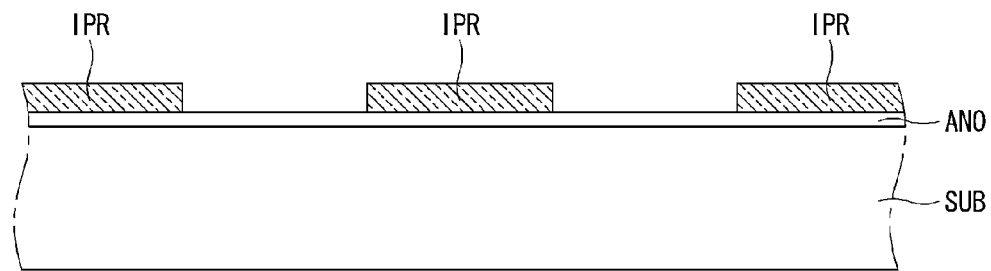

After exposure, by developing the photoresist PR with a fluorinated solvent such as hydrofluoroethers, the soluble photoresist SPR may be removed. However, the insoluble photoresist IPR remains on the organic light emitting layer EL, as shown in FIG. 6B.

Figure 6C:
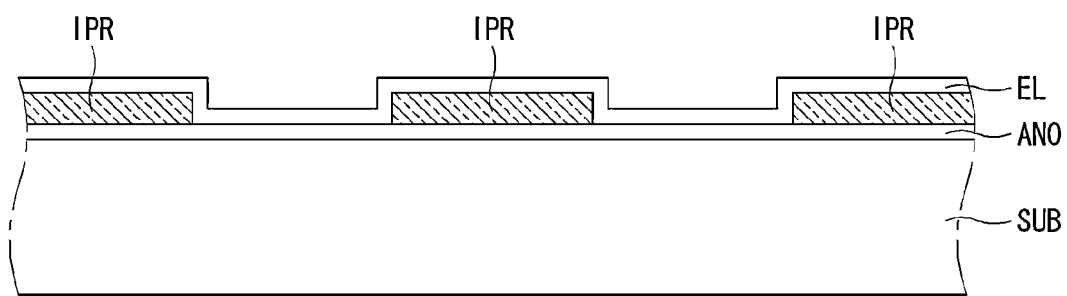

By depositing an organic light emitting material over whole surface of the substrate SUB and the insoluble photoresist IPR, an organic light emitting layer EL can be formed, as shown in FIG. 6C. Even though it is not shown in the figures, the insoluble photoresist IPR may have the reversed tapered shape at its edges.

Figure 6D:
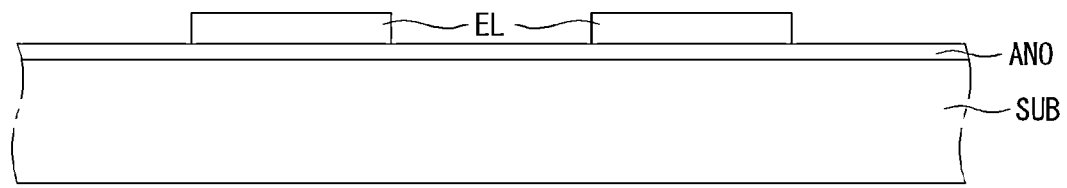

After depositing the organic light emitting layer EL, the insoluble photoresist IPR is stripped out. At the same time, portions of the organic light emitting layer EL deposited on the soluble photoresist IPR are also removed. As a result, the portions of the organic light emitting layer EL contacting the anode electrode ANO remain so that the pattern is completed, as shown in FIG. 6D. In the second embodiment of the present disclosure, a highly fluorinated solvent such as hydrofluoroethers can be used when developing the photoresist. Furthermore, in the photolithography process according to the second embodiment of the present disclosure, the exposed portions of the photoresist IPR exposed by the mask MA remain, and the organic light emitting layer EL is formed into a pattern that is the reverse of the insoluble photoresist IPR.

In the first and second embodiments of the present disclosure, by patterning the organic light emitting layer using the highly fluorinated photoresist, the method for manufacturing the organic light emitting diode display is explained. The organic light emitting material may include materials emitting red, green or blue color light or include material emitting white color light. For example, for the case of the white color light, a color filter is deposited on the organic light emitting material layer, and the color filter may be patterned using the highly fluorinated photoresist according to the present disclosure.

The manufacturing method according to the present disclosure prevents the organic light emitting material from being damaged during the patterning process by patterning the photoresist without using a photo acid generator (PAG). Additionally, the photoresist according to the present disclosure can be used not only for patterning the organic light emitting material but also for patterning the other layers.

While the embodiment of the present invention has been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:

1. A copolymer of a photoresist formed by the process comprising:
   providing a first monomer represented by formula (1) and a second monomer represented by formula (2)

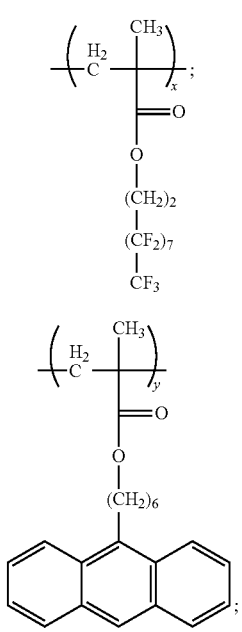

and
   forming the copolymer from the first monomer and the second monomer, where x:y is a ratio of the first monomer to the second monomer and x:y is selected from the range of x:y=1:0.1 to x:y=1:1.

2. The copolymer according to claim 1 wherein x:y is selected from the range of x:y=1:0.19 to x:y=1:0.77.

3. The copolymer according to claim 1 wherein x:y is 1:0.19.

4. The copolymer according to claim 1 wherein x:y is 1:0.25.

5. The copolymer according to claim 1 wherein x:y is 1:0.38.

6. The copolymer according to claim 1 wherein x:y is 1:0.58.

7. The copolymer according to claim 1 wherein x:y is 1:0.77.

8. A method of forming a copolymer, the method comprising:
   providing a first monomer represented by formula (1) and a second monomer represented by formula (2)

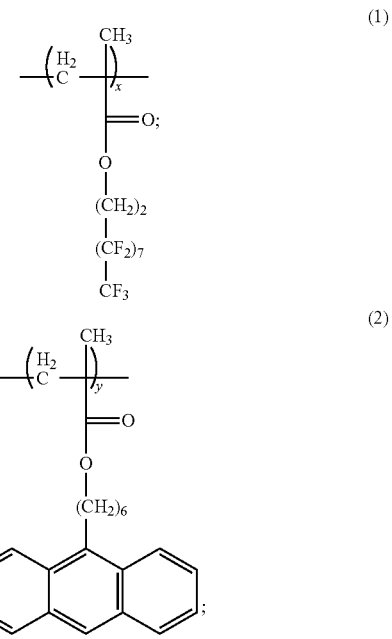

and
   forming the copolymer from the first monomer and the second monomer, where x:y is a ratio of the first monomer to the second monomer and x:y is selected from the range of x:y=1:0.1 to x:y=1:1.

9. The method according to claim 8, wherein x:y is selected from the range of x:y=1:0.19 to x:y=1:0.77.

10. The method according to claim 8, wherein x:y is 1:0.19.

11. The method according to claim 9, wherein x:y is 1:0.25.

12. The method according to claim 9, wherein x:y is 1:0.38.

13. The method according to claim 9, wherein x:y is 1:0.58.

14. The method according to claim 9, wherein x:y is 1:0.77.

* * * * *